US011166376B2

(12) United States Patent
Park et al.

(10) Patent No.: US 11,166,376 B2
(45) Date of Patent: Nov. 2, 2021

(54) ELECTRONIC COMPONENT WITH SA/BW RATIO AND BOARD HAVING THE SAME MOUNTED THEREON

(71) Applicant: SAMSUNG ELECTRO-MECHANICS CO., LTD., Suwon-si (KR)

(72) Inventors: Heung Kil Park, Suwon-si (KR); Se Hun Park, Suwon-si (KR); Hun Gyu Park, Suwon-si (KR); Woo Chul Shin, Suwon-si (KR); Ji Hong Jo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/846,806

(22) Filed: Apr. 13, 2020

(65) Prior Publication Data

US 2021/0076499 A1    Mar. 11, 2021

(30) Foreign Application Priority Data

Sep. 9, 2019    (KR) ........................ 10-2019-0111570

(51) Int. Cl.
*H05K 1/18*    (2006.01)
*H01G 2/06*    (2006.01)
(Continued)

(52) U.S. Cl.
CPC ............. *H05K 1/181* (2013.01); *H01G 2/065* (2013.01); *H01G 4/12* (2013.01); *H01G 4/232* (2013.01);
(Continued)

(58) Field of Classification Search
None
See application file for complete search history.

(56) References Cited

U.S. PATENT DOCUMENTS 4,168,520 A * 9/1979 Coleman ............... H01G 2/06
  29/25.42
10,062,511 B1 * 8/2018 Park ....................... H01G 2/06
(Continued)

FOREIGN PATENT DOCUMENTS

JP    2012-204572 A    10/2012
JP    5888281 B2        2/2016

OTHER PUBLICATIONS

Advanced_Ceramic_Component. Ayode. (Year: 2020).*

*Primary Examiner* — Timothy J. Dole
*Assistant Examiner* — Muhammed Azam
(74) *Attorney, Agent, or Firm* — Morgan, Lewis & Bockius LLP (57) ABSTRACT

A multilayer electronic component includes: a capacitor body having first to sixth surfaces, and including first and second internal; first and second external electrodes including first and second connection portions and first and second band portions; and a connection terminal including first and second land portions disposed on the first and second band portions, respectively, and having first and second cut-out portions, respectively. First and second solder accommodating portions are provided by the first and second cut-out portions in lower portions of the first and second band portions, respectively, and, 0.2≤SA1/BW1≤0.5 and 0.2≤SA2/BW2≤0.5 which in BW1 is an area of the first band portion, SA1 is an area of the first solder accommodating portion, BW2 is an area of the second band portion, and SA2 is an area of the second solder accommodating portion.

16 Claims, 8 Drawing Sheets

(51) Int. Cl.
*H01G 4/12* (2006.01)
*H01G 4/232* (2006.01)
*H05K 1/11* (2006.01)
*H01G 4/30* (2006.01)

(52) U.S. Cl.
CPC .............. *H01G 4/30* (2013.01); *H05K 1/111* (2013.01); *H05K 2201/09381* (2013.01); *H05K 2201/10015* (2013.01); *H05K 2201/2045* (2013.01)

(56) References Cited

U.S. PATENT DOCUMENTS

| | | | | |
|---|---|---|---|---|
| 10,128,050 B1* | 11/2018 | Park | ..................... | H01G 4/248 |
| 10,192,686 B1* | 1/2019 | Park | ..................... | H01G 4/232 |
| 10,347,425 B2* | 7/2019 | Park | ..................... | H05K 1/181 |
| 10,366,839 B1* | 7/2019 | Kim | ..................... | H01G 4/232 |
| 10,879,000 B2* | 12/2020 | Ji | ..................... | H05K 1/111 |
| 2011/0284278 A1* | 11/2011 | Hine | ..................... | H05K 1/111 174/260 |
| 2011/0292625 A1* | 12/2011 | Chen | ..................... | H05K 1/0295 361/768 |
| 2013/0033836 A1* | 2/2013 | Hattori | ..................... | H01G 4/232 361/768 |
| 2013/0037911 A1* | 2/2013 | Hattori | ............... | H01L 23/49805 257/532 |
| 2013/0329389 A1* | 12/2013 | Hattori | ................. | H05K 1/0216 361/782 |
| 2014/0008116 A1* | 1/2014 | Fujii | ..................... | H05K 1/0216 174/260 |
| 2014/0016242 A1* | 1/2014 | Hattori | ..................... | H05K 1/181 361/303 |
| 2014/0041914 A1* | 2/2014 | Hattori | ..................... | H01G 2/065 174/260 |
| 2014/0116766 A1* | 5/2014 | Jeon | ..................... | H01G 4/232 174/260 |
| 2014/0124256 A1* | 5/2014 | Hattori | ..................... | H05K 1/181 174/260 |
| 2014/0268486 A1* | 9/2014 | Hattori | ..................... | H01G 4/224 361/301.4 |
| 2014/0268487 A1* | 9/2014 | Yoshida | ................. | H01G 2/065 361/301.4 |
| 2014/0311791 A1* | 10/2014 | Willis | ..................... | H05K 1/111 174/261 |
| 2015/0026972 A1* | 1/2015 | Ogawa | ..................... | H01G 2/065 29/832 |
| 2015/0026973 A1* | 1/2015 | Ogawa | ................. | H05K 3/0052 29/832 |
| 2015/0131253 A1* | 5/2015 | Park | ..................... | H01G 4/01 361/782 |
| 2015/0270065 A1* | 9/2015 | Hattori | ..................... | H01G 2/065 174/255 |
| 2015/0270068 A1* | 9/2015 | Hattori | ..................... | H01C 1/14 361/301.4 |
| 2016/0088733 A1* | 3/2016 | Lee | ..................... | H05K 1/144 361/768 |
| 2016/0111215 A1* | 4/2016 | Park | ..................... | H01C 1/148 174/260 |
| 2016/0217926 A1* | 7/2016 | Jun | ..................... | H01G 4/228 |
| 2019/0066918 A1* | 2/2019 | Jeong | ..................... | H05K 1/0271 |
| 2019/0103223 A1* | 4/2019 | Park | ..................... | H01G 4/30 |
| 2019/0378656 A1* | 12/2019 | Sim | ..................... | H01G 2/065 |
| 2020/0090870 A1* | 3/2020 | Kim | ..................... | H01G 2/06 |
| 2021/0020366 A1* | 1/2021 | Park | ..................... | H01G 4/232 |
| 2021/0065983 A1* | 3/2021 | Park | ..................... | H05K 1/181 |
| 2021/0076499 A1* | 3/2021 | Park | ..................... | H01G 4/12 |

\* cited by examiner

ELECTRONIC COMPONENT WITH SA/BW RATIO AND BOARD HAVING THE SAME MOUNTED THEREON

CROSS-REFERENCE TO RELATED APPLICATION(S)

This application claims the benefit of priority to Korean Patent Application No. 10-2019-0111570 filed on Sep. 9, 2019 in the Korean Intellectual Property Office, the disclosure of which is incorporated herein by reference in its entirety.

TECHNICAL FIELD

The present disclosure relates to a multilayer electronic component and a board having the same mounted thereon.

BACKGROUND

A multilayer capacitor, a multilayer electronic component, is formed of a dielectric material, and the dielectric material has piezoelectricity, and can thus modified in synchronization with the applied voltage.

When the period of the applied voltage is in an audio frequency band, the displacement becomes vibrations. Then, the vibrations are transmitted to a board through a solder, and vibrations of the board may be experienced as sound. This sound is referred to as acoustic noise.

The acoustic noise may be perceived as a malfunction of a device by the user due to a strange sound when the operating environment of the device is quiet.

In addition, in a device having a voice circuit, acoustic noise may be superimposed on the voice output to reduce a quality of the device.

In addition, apart from the acoustic noise perceived by the human ear, when piezoelectric vibrations of a multilayer capacitor are generated in a high frequency region of 20 kHz or more, it may cause malfunctioning of various sensors used in IT and industrial/electrical fields.

SUMMARY

An aspect of the present disclosure is to provide a multilayer electronic component and a board having the same mounted thereon, the multilayer electronic component being capable of securing adhesion strength at a certain level or more while reducing acoustic noise in an audio frequency range of less than 20 kHz and high frequency vibrations of 20 kHz or more.

According to an aspect of the present disclosure, a multilayer electronic component includes: a capacitor body having a first surface, a mounting surface, and a second surface, opposing the first surface, third and fourth surfaces connected to the first and second surfaces and opposing each other, and fifth and sixth surfaces connected to the first and second surfaces, connected to the third and fourth surfaces, and opposing each other, and including first and second internal electrodes having one ends alternately exposed through the third and fourth surfaces; first and second external electrodes including first and second connection portions disposed on the third and fourth surfaces of the capacitor body, respectively, and first and second band portions disposed on the first surface of the capacitor body and spaced apart from each other; and a connection terminal including first and second land portions disposed on the first and second band portions, respectively, and having first and second cut-out portions, respectively. First and second solder accommodating portions are provided by the first and second cut-out portions in lower portions of the first and second band portions, respectively, and, when an area of the first band portion is defined as BW1, an area of the first solder accommodating portion is defined as SA1, an area of the second band portion is defined as BW2, and an area of the second solder accommodating portion is defined as SA2, $0.2 \leq SA1/BW1 \leq 0.5$ and $0.2 \leq SA2/BW2 \leq 0.5$ are satisfied.

The first and second internal electrodes may be alternately stacked in a direction connecting the first and second surfaces of the capacitor body.

The first and second internal electrodes may be alternately stacked in a direction connecting the fifth and sixth surfaces of the capacitor body.

The first and second cut-out portions may be formed to allow portions of the first and second land portions, opposing each other, to be open in a direction connecting the third and fourth surfaces of the capacitor body.

The first and second land portions may be formed of a conductor.

The first and second land portions may be formed of an insulator, and surfaces of the first and second land portions may be provided with conductor layers, respectively.

Conductive bonding layers may be disposed between the first band portion and the first land portion, and between the second band portion and the second land portion, respectively.

The connection terminal may further include a bridge portion disposed between the first and second land portions, and formed of a non-conductive material.

The first and second land portions may be formed of an insulator and are formed integrally with the bridge portion, and surfaces of the first and second land portions may be provided with conductor layers, respectively.

The first and second land portions and the bridge portion may be formed of alumina.

The first and second land portions may be formed of a conductor, and the bridge portion and the first and second land portions may have a separate type.

According to another aspect of the present disclosure, a board having a multilayer electronic component mounted thereon includes: a board having first and second electrode pads on one surface; and a multilayer electronic component mounted to allow first and second land portions to be connected to the first and second electrode pads, respectively.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Figure 1:
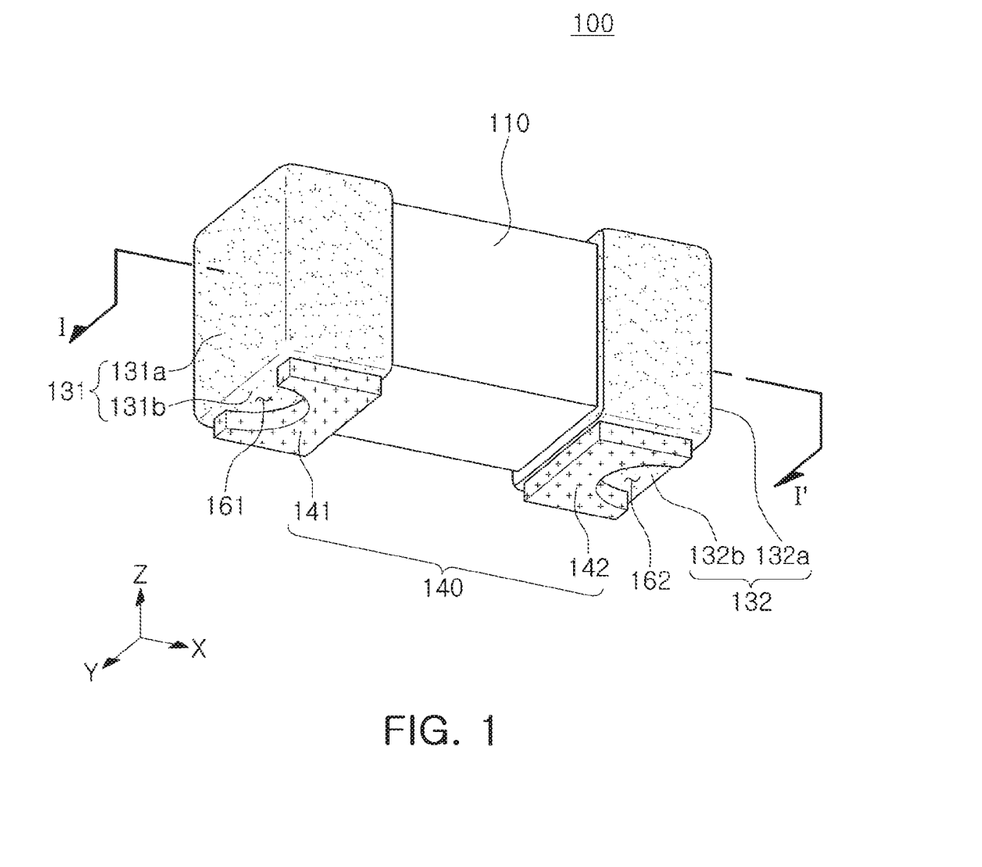
FIG. 1 is a schematic perspective view of a multilayer electronic component according to an embodiment of the present disclosure.
Figure 2:
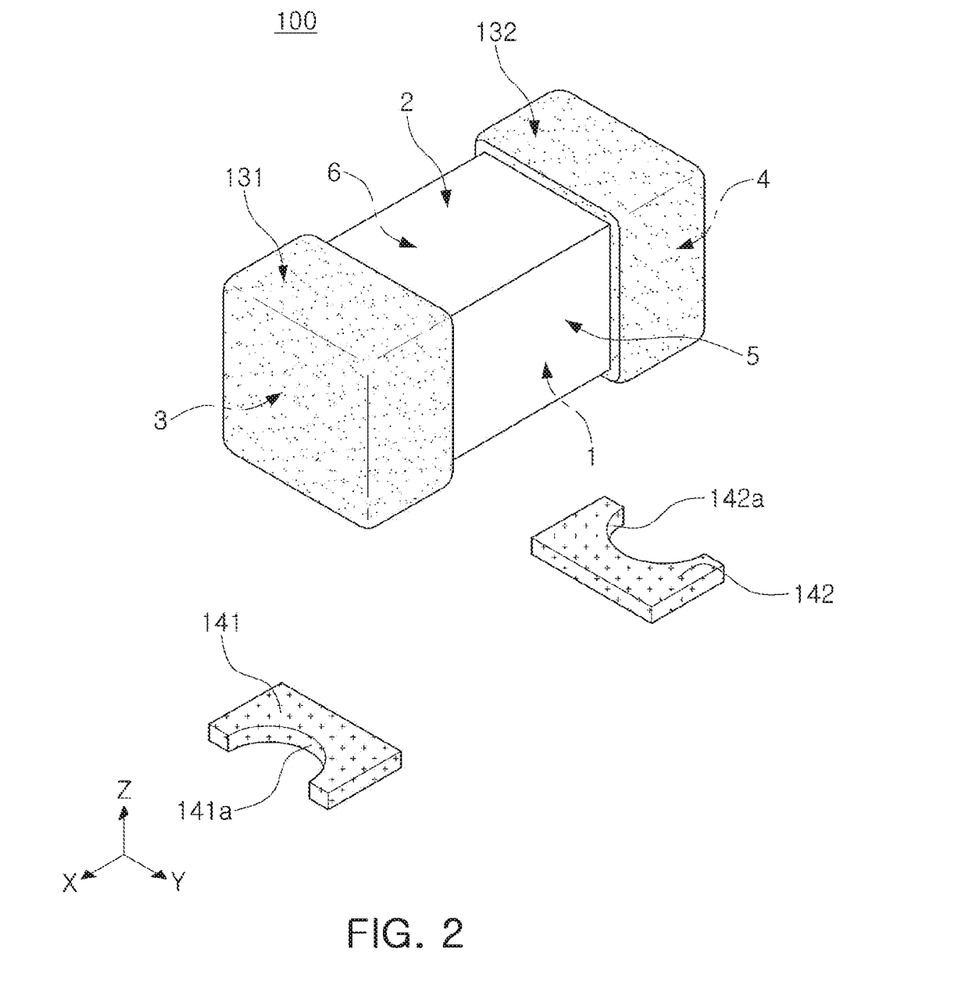
FIG. 2 is an exploded perspective view illustrating a connection terminal separated from FIG. 1.
Figure 3:
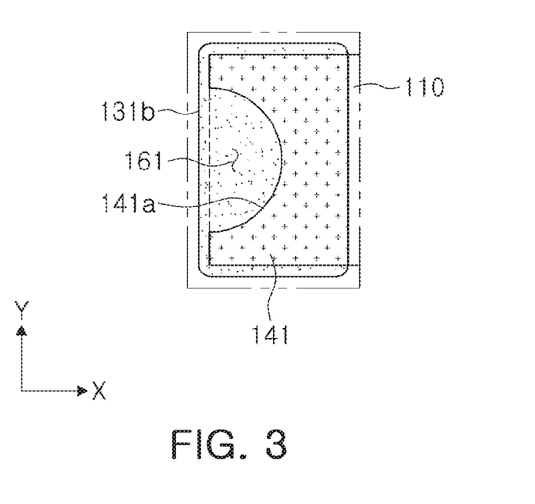
FIG. 3 is a bottom view illustrating a first band portion and a first land portion in FIG. 1.
Figure 4A:
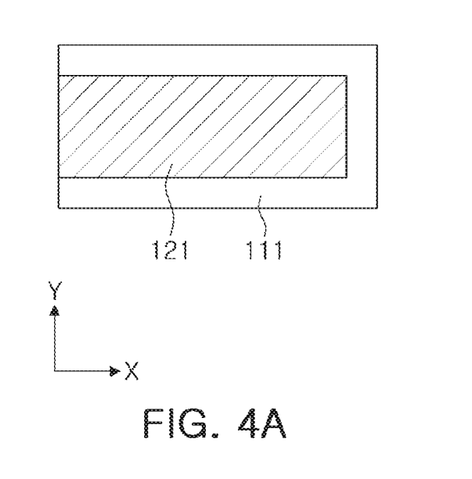
FIGS. 4A and 4B are plan views illustrating first and second internal electrodes of a multilayer electronic component according to an embodiment of the present disclosure, respectively.
Figure 4B:
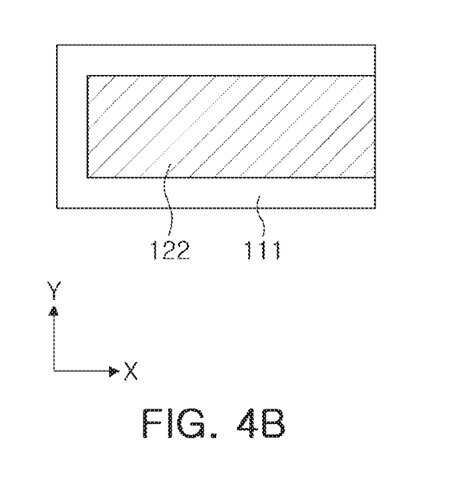
Figure 5:
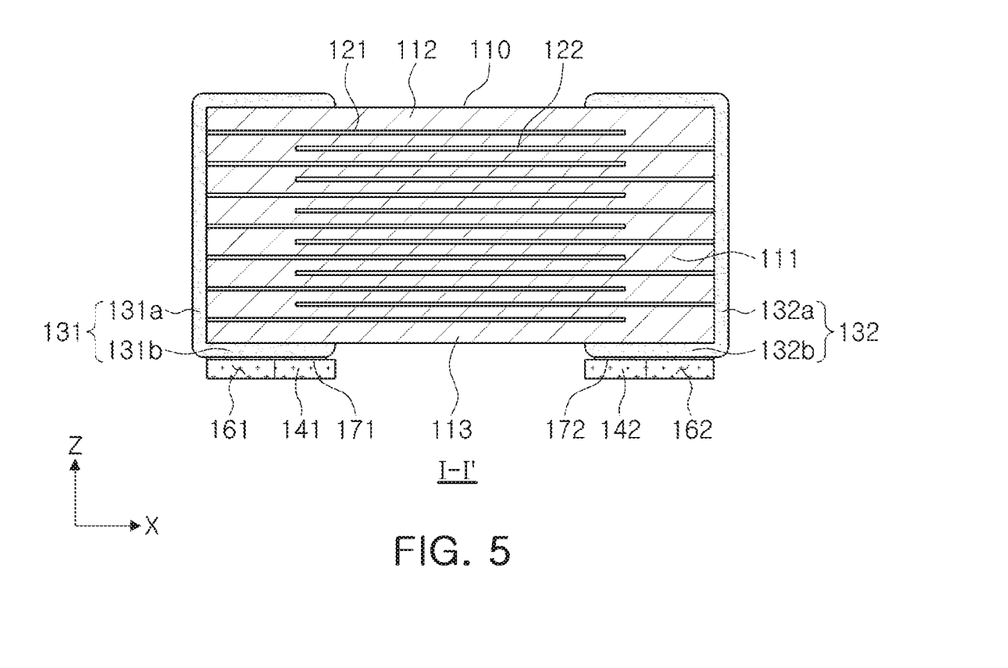
FIG. 5 is a cross-sectional view taken along line I-I' of FIG. 1.

FIG. 1 is a schematic perspective view of a multilayer electronic component according to an embodiment of the present disclosure, FIG. 2 is an exploded perspective view illustrating a connection terminal separated from FIG. 1, FIG. 3 is a bottom view illustrating a first band portion and a first land portion in FIG. 1, FIGS. 4A and 4B are plan views illustrating first and second internal electrodes of a multilayer electronic component according to an embodiment of the present disclosure, respectively, and FIG. 5 is a cross-sectional view taken along line I-I' of FIG. 1.

Referring to FIGS. 1 to 5, a multilayer electronic component 100 according to an embodiment of the present disclosure includes a multilayer capacitor including a capacitor body 110 and a plurality of external electrodes disposed on a mounting surface of the capacitor body 110 and spaced apart from each other and a connection terminal 140 including a plurality of land portions disposed on each of the external electrodes.

Hereinafter, when directions of a capacitor body 110 are defined to clearly describe embodiments in the present disclosure, X, Y, and Z on the drawings indicate a length direction, a width direction, and a thickness direction of the capacitor body 110, respectively. Moreover, in an embodiment, the Z direction may be used as having the same meaning as a stacking direction in which dielectric layers are stacking on each other.

The capacitor body 110 is provided by stacking plurality of dielectric layers 111 in the Z-direction and sintering the dielectric layers, and may include a plurality of the dielectric layers 111, a plurality of first internal electrodes 121 and a plurality of second internal electrodes 122 alternately disposed in the Z-direction with the dielectric layers 111 respectively interposed therebetween.

In addition, covers 112 and 113 having a predetermined thickness may be further formed in both sides in the Z-direction of the capacitor body 110.

In this case, respective dielectric layers 111 of the capacitor body 110, adjacent to each other, may be integrated, so boundaries therebetween may not be identified.

The capacitor body 110 may have a substantially hexahedral shape, but an embodiment of the present disclosure is not limited thereto.

In an embodiment, for convenience of explanation, both surfaces of the capacitor body 110, opposing each other in a Z direction, are defined as a first surface 1 and a second surface 2, both surfaces, connected to the first surface 1 and the second surface 2 and opposing each other in an X direction, are defined as a third surface 3 and a fourth surface 4, and both surfaces connected to the first surface 1 and the second surface 2, connected to the third surface 3 and the fourth surface 4, and opposing each other in a Y direction, are defined as a fifth surface 5 and a sixth surface 6. In an embodiment, the first surface 1 may be a mounting surface.

The dielectric layers 111 may include a ceramic material having high permittivity, for example, a barium titanate (BaTiO$_3$)-based ceramic powder, but an embodiment of the present disclosure is not limited thereto.

The BaTiO$_3$-based ceramic powder may be, for example, (Ba$_{1-x}$Ca$_x$)TiO$_3$, Ba(Ti$_{1-y}$Ca$_y$)O$_3$, (Ba$_{1-x}$Ca$_x$)(Ti$_{1-y}$Zr$_y$)O$_3$, Ba(Ti$_{1-y}$Zr$_y$)O$_3$, or the like, in which Ca or Zr is partially dissolved in BaTiO$_3$(BT), but an embodiment of the present disclosure is not limited thereto.

Moreover, a ceramic additive, an organic solvent, a plasticizer, a binder, a dispersant, or the like may also be added to the dielectric layers 111 along with the ceramic powder.

The ceramic additive may be, for example, a transition metal oxide or a transition metal carbide, a rare earth element, magnesium (Mg), aluminum (Al), or the like.

The first and second internal electrodes 121 and 122 are electrodes having different polarities, and are alternately disposed to oppose each other in the Z direction with the dielectric layers 111 interposed therebetween. One ends of the first and second internal electrodes may be exposed through the third surface 3 and the fourth surface 4 of the capacitor body 110, respectively.

In this case, the first and second internal electrodes 121 and 122 may be electrically isolated from each other by the dielectric layers 111 interposed therebetween.

As described above, the ends of the first and second internal electrodes 121 and 122, alternately exposed through the third surface 3 and the fourth surface 4 of the capacitor body 110, are in contact with and connected to the first and second connection portions 131a and 132a, disposed on the third surface 3 and the fourth surface 4 of the capacitor body 110, respectively, in first and second external electrodes 131 and 132, which will be described later.

In this case, the first and second internal electrodes 121 and 122 are formed of a conductive metal, for example, a material such as nickel (Ni), a nickel (Ni) alloy, or the like, but an embodiment of the present disclosure is not limited thereto.

According to the above configuration, when a predetermined voltage is applied to the first and second external electrodes 131 and 132, charges are accumulated between the first and second internal electrodes 121 and 122, opposing each other.

In this case, the capacitance of the multilayer electronic component 100 is proportional to an area of overlap between the first and second internal electrodes 121 and 122, overlapping each other in the Z direction.

In an embodiment, a plurality of external electrodes may include first and second external electrodes 131 and 132.

The first and second external electrodes 131 and 132 are disposed to be spaced apart from each other in the X direction on the first surface 1, a mounting surface of the capacitor body 110, receive voltages having different polarities, and are in contact with and connected to exposed portions of the first and second internal electrodes 121 and 122.

A plating layer may be formed on a surface of each of the first and second external electrodes 131 and 132.

For example, each of the first and second external electrodes 131 and 132 may include a conductive layer, a nickel (Ni) plating layer formed on the conductive layer, and a tin (Sn) plating layer formed on the nickel plating layer.

The first external electrode 131 may include a first connection portion 131a and a first band portion 131b.

The first band portion 131b is disposed in a portion of the first surface 1 of the capacitor body 110, and a first land portion of a connection terminal to be described later is in contact with and connected to the first band portion.

The first connection portion 131a is extended from the first band portion 131b to the third surface 3 of the capacitor body 110, and is a portion in contact with the first internal electrode 121 exposed through the third surface 3 of the capacitor body 110.

In this case, the first band portion 131b may be further extended to portions of the fifth surface 5 and the sixth surface 6 and a portion of the second surface 2 of the capacitor body 110, if needed, for improving adhesion strength.

The second external electrode 132 may include a second connection portion 132a and a second band portion 132b.

The second band portion 132b is disposed in the first surface 1 of the capacitor body 110 and spaced apart from the first band portion 131b in the X direction, and a second land portion of a connection terminal to be described later is in contact with and connected to the second band portion.

The second connection portion 132a is extended from the second band portion 132b to the fourth surface 4 of the capacitor body 110, and is a portion in contact with the second internal electrode 122 exposed through the fourth surface 4 of the capacitor body 110.

In this case, the second band portion 132b may be further extended to portions of the fifth surface 5 and the sixth surface 6 and a portion of the second surface 2 of the capacitor body 110, if needed, for improving adhesion strength.

The connection terminal 140 includes first and second land portions 141 and 142 disposed to be spaced apart from each other in the X-direction.

The first and second land portions 141 and 142 may be disposed on the first band portion 131b of the first external electrode 131 and the second band portion 132b of the second external electrode 132, respectively.

In this case, the first land portion 141 of the first band portion 131b and the second land portion 142 of the second band portion 132b may be bonded using conductive adhesives 171 and 172 such as a solder or conductive paste with a high melting point.

The first land portion 141 may be formed of an insulator as a non-conductive material, and may be provided as an insulating board or a circuit board such as FR4, F-PCB, or the like, by way of example, but an embodiment of the present disclosure is not limited thereto.

In addition, a conductor layer formed of a conductive metal may be formed on a surface of the first land portion 141. The conductor layer may be formed of a plating layer.

Moreover, the first cut-out portion 141a may be formed in the first land portion 141. The first cut-out portion 141a may be formed in a portion of a circumferential surface connecting two surfaces of the first land portion 141 opposing each other in the Z-direction.

In this case, an upper surface of the first land portion 141 is a portion with which the first band portion 131*b* is in contact, a lower surface of the first land portion 141 is a portion in contact with a board, and the first cut-out portion 141*a* may serve to connect the upper surface and the lower surface of the first land portion 141 to each other.

Here, a first solder accommodating portion 161 may be provided as a solder pocket in a lower portion of the first band portion 131*b* of the first external electrode 131 to the first surface 1 of the capacitor body 110.

In an embodiment, the first cut-out portion 141*a* may be formed to be open in a direction toward the third surface 3 of the capacitor body 110 in the X-direction.

In this case, the first cut-out portion 141*a* may be formed to have a curved surface, but an embodiment of the present disclosure is not limited thereto.

In addition, a conductive bonding layer 171 may be disposed between an upper surface of the first land portion 141 and the first band portion 131*b*.

The second land portion 142 may be formed of an insulator as a non-conductive material, and may be provided as an insulating board or a circuit board such as FR4, F-PCB, or the like, by way of example, but an embodiment of the present disclosure is not limited thereto.

In addition, a conductor layer formed of a conductive metal may be formed on a surface of the second land portion 142. The conductor layer may be formed of a plating layer.

Moreover, the second cut-out portion 142*a* may be formed in the second land portion 142. The second cut-out portion 142*a* may be formed in a portion of a circumferential surface connecting two surfaces of the second land portion 142 opposing each other in the Z-direction.

In this case, an upper surface of the second land portion 142 is a portion with which the second band portion 132*b* is in contact, a lower surface of the second land portion 142 is a portion in contact with a board, and the second cut-out portion 142*a* may serve to connect the upper surface and the lower surface of the second land portion 142 to each other.

Here, a second solder accommodating portion 162 may be provided as a solder pocket in a lower portion of the second band portion 132*b* of the second external electrode 132 to the first surface 1 of the capacitor body 110.

In an embodiment, the second cut-out portion 142*a* may be formed to be open in a direction opposing the first cut-out portion 141*a* in the X-direction, and to be open in a direction toward the fourth surface 4 of the capacitor body 110 in the X-direction.

In this case, the second cut-out portion 142*a* may be formed to oppose the first cut-out portion 141*a* in the X-direction.

In addition, the second cut-out portion 142*a* may be formed to have a curved surface, but an embodiment of the present disclosure is not limited thereto.

The second land portion 142 may have a substantially symmetrical structure with the first land portion 141 in the X direction.

In addition, a conductive bonding layer 172 may be disposed between an upper surface of the second land portion 142 and the second band portion 132*b*.

Moreover, in an embodiment, a conductor layer is formed in the entirety of a circumferential surface of the first and second land portions 141 and 142. In this case, during soldering, the soldering is performed on the entirety of the circumferential surface of the first and second land portions 141 and 142 including inner sides of the first and second cut-out portions 141*a* and 142*a*. Thus, when a multilayer capacitor is mounted on a board, a degree of misalignment between the multilayer capacitor and the board may be improved.

In addition, during the soldering, a bonding area between the first and second land portions 141 and 142 and a solder may be increased to improve adhesion strength of the multilayer capacitor.

Moreover, the first and second land portions 141 and 142 of the connection terminal 140 allow the board, on which the capacitor body is to be mounted, and the capacitor body 110 to be spaced apart from each other by a predetermined distance, and the solder is confined. Thus, formation of a solder fillet to the second surface 2 of the capacitor body 110 is suppressed to reduce the inflow of piezoelectric vibrations generated in the capacitor body 110 into the board.

In order to significantly increase the role of the first and second solder accommodating portions 161 and 162 to confine the solder, the first and second cut-out portions 141*a* and 142*a* may be only formed of a conductor in the first and second land portions 141 and 142 is necessary.

Meanwhile, in the connection terminal 140 in an embodiment, the first and second land portions 141 and 142 may be formed of a conductor.

When the first and second land portions 141 and 142 are formed of a conductor, it is not necessary to form an additional conductor layer in the first and second land portions 141 and 142.

Referring to FIG. 3, in an embodiment, when an area of the first band portion 131*b* is defined as BW1, an area of the first solder accommodating portion 161 is defined as SA1, an area of the second band portion 132*b* is defined as BW2, and an area of the second solder accommodating portion 162 is defined as SA2, $0.2 \leq SA1/BW1 \leq 0.5$ and $0.2 \leq SA2/BW2 \leq 0.5$ may be satisfied.

If SA1/BW1 and SA2/BW2 exceed 0.5, an area of a solder accommodating portion is significantly large. In this case, when a multilayer electronic component is mounted on a board, a bonding area between a land portion and a pad of a board is reduced, so bonding strength and adhesion strength of the land portion are reduced and reliability may also be reduced.

If SA1/BW1 and SA2/BW2 are less than 0.2, an area of a solder accommodating portion is significantly reduced. In this case, a solder fillet is not properly suppressed, so an amount of reducing vibrations transmitted from a multilayer capacitor to a board is reduced, and as a result, the connection terminal 140 loses its role as a noise reduction structure.

Thus, in an embodiment, when $0.2 \leq SA1/BW1 \leq 0.5$ and $0.2 \leq SA2/BW2 \leq 0.5$ are satisfied, reliability may be improved by securing adhesion strength at a certain level while reducing acoustic noise by a certain level.

In an exemplary embodiment, the first and second land portions are attached to a multilayer capacitor in which a length in the X direction is about 16 mm, a length in the Y direction is about 8 mm, and the capacity is about 10 µF, and are then mounted on a pad of a board. The term "about" used in context with a quantity, as used herein, includes a range of values around the referred quantity including tolerances for manufacturing and measurement. For example, the term "about" may include a 10% deviation from the referred quantity.

In this case, when $0.2 \leq SA1/BW1 \leq 0.5$ and $0.2 \leq SA2/BW2 \leq 0.5$ are satisfied, an average acoustic noise of a multilayer electronic component is 35.2 dB, and average bonding strength of the first and second land portions is 23.5 N.

In addition, under the same conditions, when SA1/BW1 and SA2/BW2 are less than 0.2, acoustic noise of a multilayer capacitor are equal to or more than 40.2 dB, and bonding strength of the first and second land portions is equal to or more than 28.5 N.

That is, the bonding strength is improved, but acoustic noise is significantly increased.

Moreover, under the same conditions, when SA1/BW1 and SA2/BW2 exceed 0.5, acoustic noise of a multilayer capacitor is equal to or less than 29.6 dB, and bonding strength of the first and second land portions is equal to or less than 6.1 N.

That is, the acoustic noise is improved, but bonding strength of a land portion is significantly lowered.

Figure 6A:
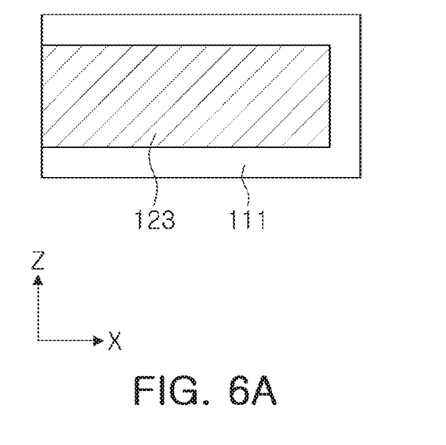
FIGS. 6A and 6B are plan views illustrating first and second internal electrodes of a multilayer electronic component according to another embodiment of the present disclosure, respectively.
Figure 6B:
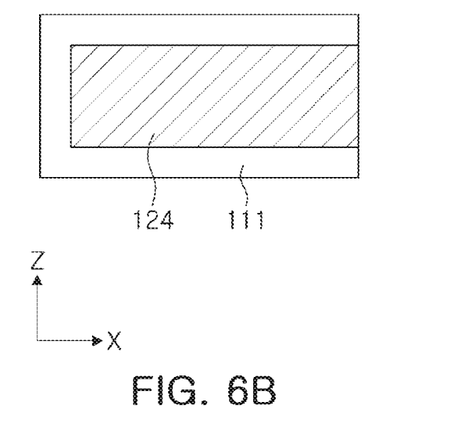
Figure 7:
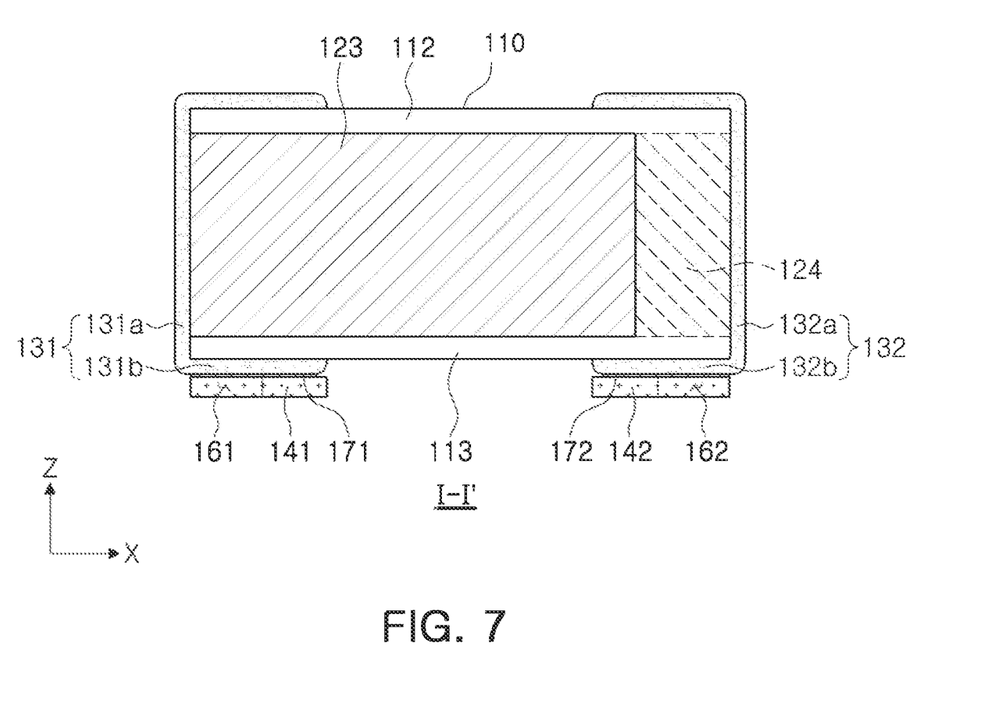
FIG. 7 is a cross-sectional view illustrating a multilayer electronic component, taken along line I-I' of FIG. 1, according to another embodiment of the present disclosure.

FIGS. 6A and 6B are plan views illustrating first and second internal electrodes of a multilayer electronic component according to another embodiment of the present disclosure, respectively, and FIG. 7 is a cross-sectional view illustrating the multilayer electronic component, taken along line I-I' of FIG. 1, according to another embodiment of the present disclosure.

Here, detailed descriptions similar to those in the above-described embodiment are omitted in order to avoid duplication.

As illustrated in FIGS. 6A and 7, in another embodiment of the present disclosure, first and second internal electrodes 123 and 124 may be alternately stacked in the Y direction to connect the fifth and sixth surfaces 5 and 6 of the capacitor body 110 with dielectric layers 111 interposed therebetween.

Figure 8:
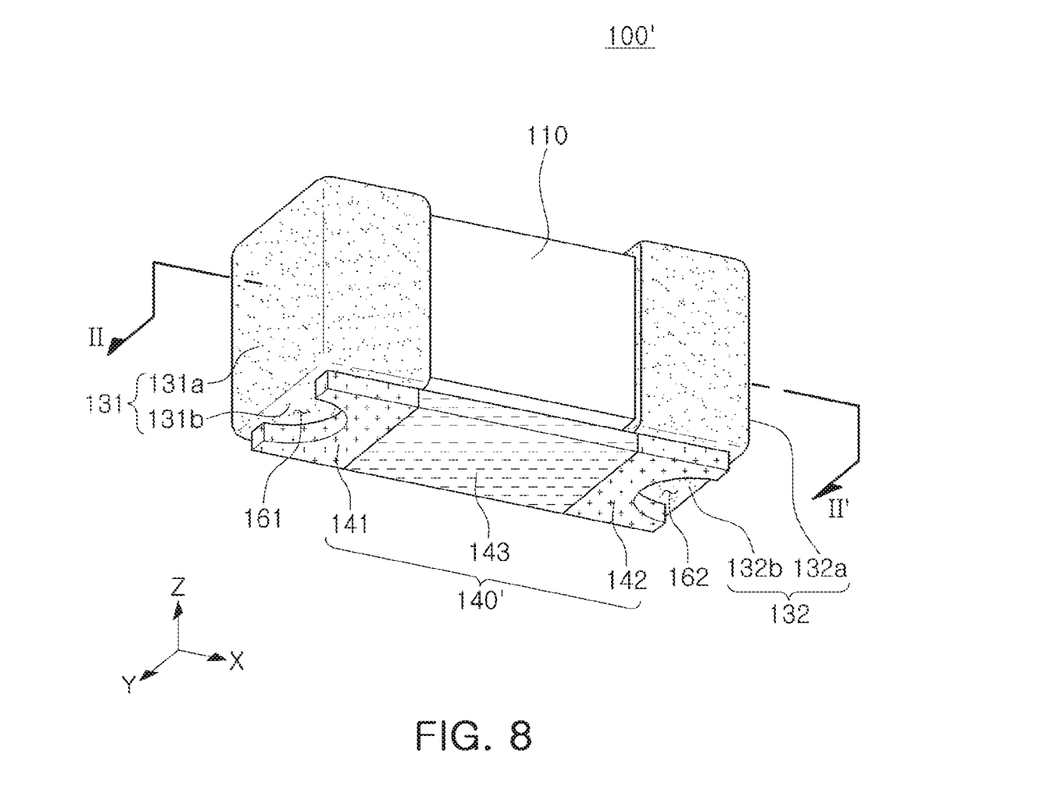
FIG. 8 is a schematic perspective view of a multilayer electronic component according to still another embodiment of the present disclosure.
Figure 9:
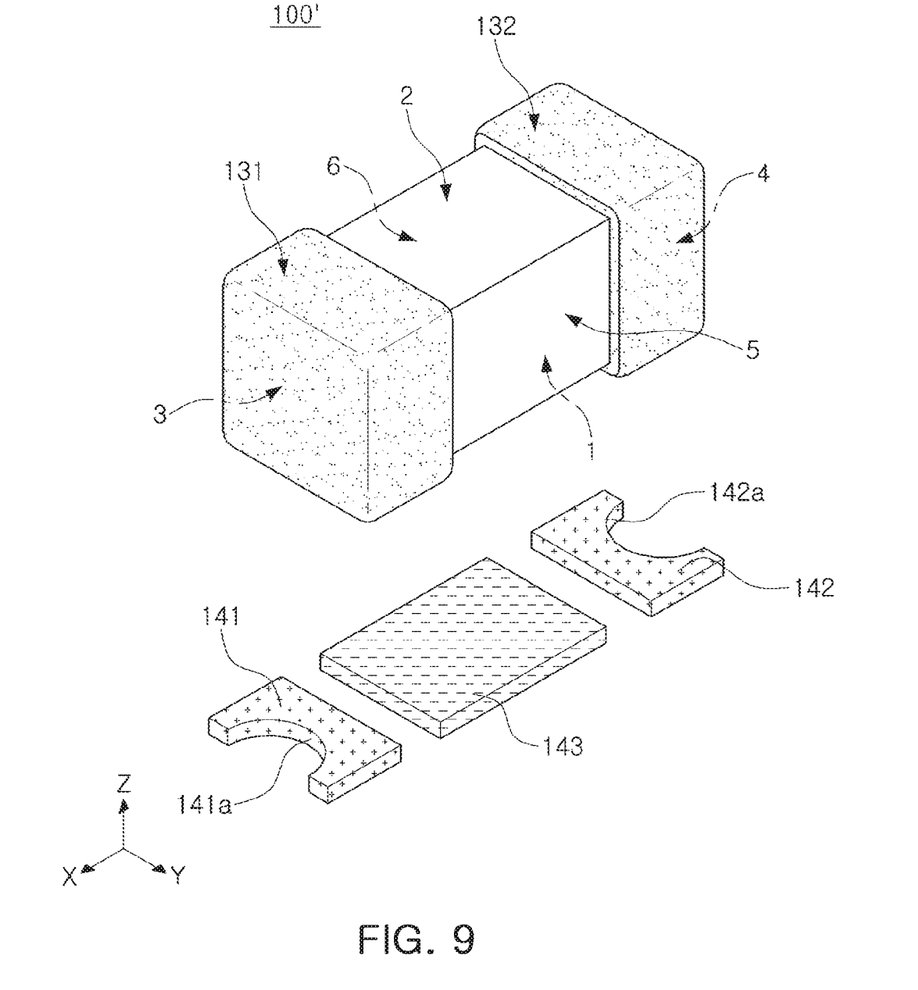
FIG. 9 is an exploded perspective view illustrating a connection terminal separated from FIG. 8.
Figure 10:
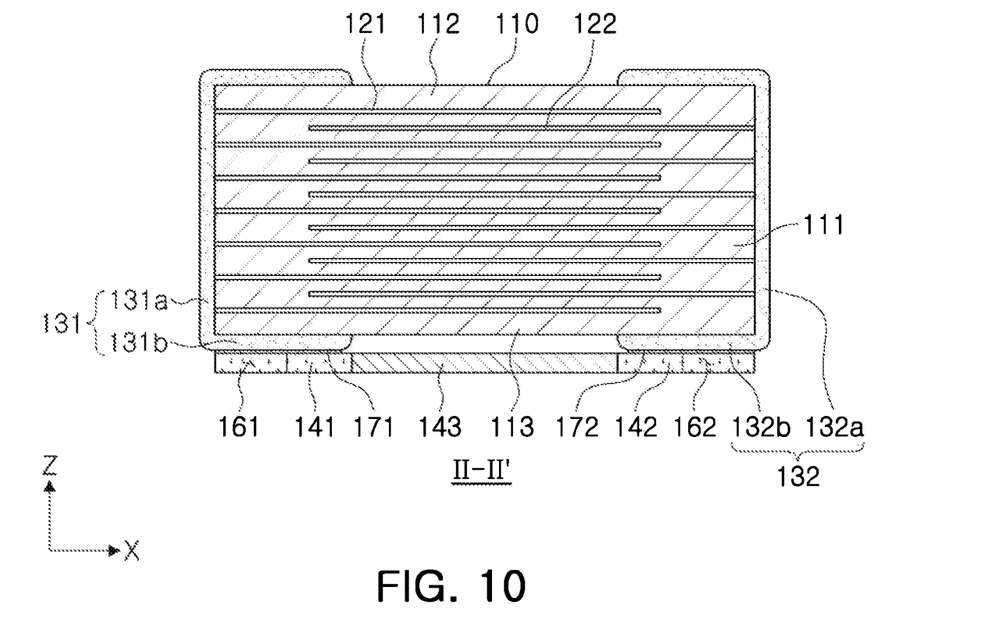
FIG. 10 is a cross-sectional view taken along line II-II' of FIG. 8.

FIG. 8 is a schematic perspective view of a multilayer electronic component according to still another embodiment of the present disclosure, FIG. 9 is an exploded perspective view illustrating a connection terminal separated from FIG. 8, and FIG. 10 is a cross-sectional view taken along line II-II' of FIG. 8.

Here, detailed descriptions similar to those in the above-described embodiment are omitted in order to avoid duplication.

Referring to FIGS. 8 to 10, in a multilayer electronic component 100' according to still another embodiment of the present disclosure, a connection terminal 140' may have an interposer form.

In an embodiment, in the connection terminal 140', a bridge portion 143 may be disposed between first and second land portions 141 and 142, adjacent to each other.

The bridge portion 143 may be formed of an insulator, as a non-conductive material, and both ends may be disposed to be adjacent to the first and second land portions 141 and 142 between the first and second land portions 141 and 142 in the X-direction.

For example, the bridge portion 143 may be provided as an insulating board or a circuit board such as FR4, F-PCB, or the like, by way of example, but an embodiment of the present disclosure is not limited thereto.

Both ends of the bridge portion 143 are provided with the first and second land portions 141 and 142, so positions of the first and second land portions 141 and 142 are easily matched when the connection terminal 140' is attached to the first and second external electrodes 131 and 132.

In this case, when the first and second land portions 141 and 142 and the bridge portion 143 are formed of the same material, the first and second land portions 141 and 142 and the bridge portion 143 may be formed integrally with each other.

In this case, the first and second land portions 141 and 142 and the bridge portion 143 may be formed of a ceramic material as a non-conductive material.

For example, the first and second land portions 141 and 142 and the bridge portion 143 may be formed of a ceramic material such as alumina, but an embodiment of the present disclosure is not limited thereto.

Meanwhile, in the connection terminal 140' in an embodiment, the first and second land portions 141 and 142 may be formed of a conductor.

In this case, in the connection terminal 140', the bridge portion 143 is formed to be separated from the first and second land portions 141 and 142.

Figure 11:
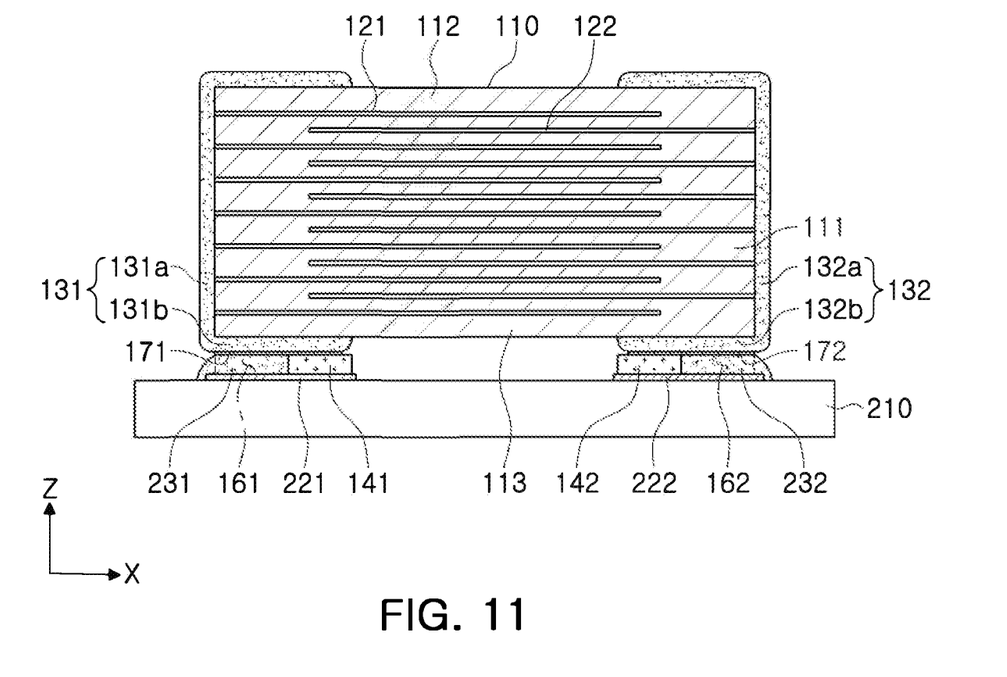
FIG. 11 is a schematic cross-sectional view illustrating a multilayer electronic component, according to an embodiment of the present disclosure, mounted on a board.

Referring to FIG. 11, a mounting board of a multilayer electronic component according to an embodiment includes a board 210 having first and second electrode pads 221 and 222 on one surface, as well as a multilayer electronic component mounted to connect first and second land portions 141 and 142 to the first and second electrode pads 221 and 222, respectively, on an upper surface of the board 210.

In an embodiment, although the multilayer electronic component is illustrated and described as being mounted on the board 210 by solders 231 and 232, a conductive paste may be used instead of solder, if necessary.

While a multilayer capacitor is mounted on a board, voltages having different polarities are applied to the first and second external electrodes formed in the multilayer capacitor. In this case, the capacitor body is expanded and contracted in the Z direction due to an inverse piezoelectric effect of a dielectric layer, so both ends of the first and second external electrodes may be expanded and contracted as opposed to expansion and contraction in the Z direction of the capacitor body due to the Poisson effect.

The expansion and contraction may cause vibrations. In addition, the vibrations may be transferred from the first and second external electrodes to a board. Thus, the sound is radiated from the board and becomes acoustic noise.

When a multilayer capacitor is directly mounted on a board without a connection terminal, a solder, formed between the first and second external electrodes and the first and second electrode pads formed on one surface of a board, is formed to a certain height toward the second surface of the capacitor body. Thus, a large amount of vibrations generated from the multilayer capacitor may be transmitted to the board.

In an embodiment, piezoelectric vibrations, transmitted to a board to the first and second external electrodes 131 and 132 of the multilayer electronic component 100, are absorbed through elasticity of the first and second land portions 141 and 142, formed of an insulator, a soft material. Thus, acoustic noise may be reduced.

In this case, the first and second solder accommodating portions 161 and 162 provided by the first and second cut-out portions 141a and 142a of the first and second land portions 141 and 142, respectively, may serve as solder pockets for confining solders 231 and 232.

In this regard, the solders 231 and 232 are effectively confined by the first and second solder accommodating portions 161 and 162, so a height of a solder fillet toward the second surface of the capacitor body 110 may be reduced.

Thus, a piezoelectric vibration transmission path of the multilayer electronic component 100 is blocked, and maximum displacement points at the solder fillet and the capacitor body 110 are spaced apart from each other, so acoustic noise reduction effect may be significantly improved as compared with the case in which a multilayer capacitor is directly mounted on a board without a connection terminal.

In addition, according to a structure of the multilayer electronic component in an embodiment described above, due to the acoustic noise reduction structure, an amount of vibrations in which piezoelectric vibrations of a multilayer electronic component are transmitted to a board at the audible frequency within 20 kHz of the multilayer electronic component may also be effectively suppressed.

Thus, malfunction of sensors, which may be a problem by high frequency vibrations of 20 kHz or more of an electronic component at an IT or industrial/electrical field, is prevented by reducing high frequency vibrations of a multilayer electronic component, and internal fatigue accumulation caused by long time vibrations of sensors may be suppressed.

As set forth above, according to an embodiment in the present disclosure, acoustic noise in an audio frequency range of less than 20 kHz and high frequency vibrations of 20 kHz or more, of a multilayer electronic component, may be reduced, and adhesion strength at a certain level or more may be secured.

While exemplary embodiments have been shown and described above, it will be apparent to those skilled in the art that modifications and variations could be made without departing from the scope of the present invention as defined by the appended claims.

What is claimed is:

1. A multilayer electronic component, comprising:
    a capacitor body having a first surface, a mounting surface, and a second surface, opposing the first surface, third and fourth surfaces connected to the first and second surfaces and opposing each other, and fifth and sixth surfaces connected to the first and second surfaces, connected to the third and fourth surfaces, and opposing each other, and including first and second internal electrodes each having an end respectively exposed through the third and fourth surfaces;
    first and second external electrodes including first and second connection portions disposed on the third and fourth surfaces of the capacitor body, respectively, and first and second band portions disposed on the first surface of the capacitor body and spaced apart from each other; and
    a connection terminal including first and second land portions disposed on the first and second band portions, respectively, and having first and second cut-out portions, respectively,
    wherein first and second solder accommodating portions are provided by the first and second cut-out portions in lower portions of the first and second band portions, respectively, and wherein $0.2 \leq SA1/BW1 \leq 0.5$ and $0.2 \leq SA2/BW2 \leq 0.5$ so as to secure adhesion/bonding strength at a certain level or more and acoustic noise at a certain level or less, where BW1 is an area of the first band portion, SA1 is an area of the first solder accommodating portion, BW2 is an area of the second band portion, and SA2 is an area of the second solder accommodating portion.

2. The multilayer electronic component of claim 1, wherein the first and second internal electrodes are alternately stacked in a direction connecting the first and second surfaces of the capacitor body.

3. The multilayer electronic component of claim 1, wherein the first and second internal electrodes are alternately stacked in a direction connecting the fifth and sixth surfaces of the capacitor body.

4. The multilayer electronic component of claim 1, wherein the first and second cut-out portions are formed to allow portions of the first and second land portions, opposing each other, to be open in a direction connecting the third and fourth surfaces of the capacitor body.

5. The multilayer electronic component of claim 1, wherein the first and second land portions are formed of a conductor.

6. The multilayer electronic component of claim 1, wherein the first and second land portions are formed of an insulator, and surfaces of the first and second land portions are provided with conductor layers, respectively.

7. The multilayer electronic component of claim 1, wherein conductive bonding layers are disposed between the first band portion and the first land portion, and between the second band portion and the second land portion, respectively.

8. The multilayer electronic component of claim 1, wherein the connection terminal further includes a bridge portion disposed between the first and second land portions, and formed of a non-conductive material.

9. The multilayer electronic component of claim 8, wherein the first and second land portions are formed of an insulator and are formed integrally with the bridge portion, and surfaces of the first and second land portions are provided with conductor layers, respectively.

10. The multilayer electronic component of claim 9, wherein the first and second land portions and the bridge portion are formed of alumina.

11. The multilayer electronic component of claim 8, wherein the first and second land portions are formed of a conductor.

12. A board having a multilayer electronic component mounted thereon, comprising:
    a board having first and second electrode pads on one surface; and
    the multilayer electronic component according to claim 1 mounted to allow the first and second land portions to be connected to the first and second electrode pads, respectively.

13. A multilayer electronic component, comprising:
    a body comprising dielectric layers interposed between alternately stacked first and second internal electrodes, each of the first and second internal electrodes having an edge respectively exposed to third and fourth surfaces of the body opposing each other;
    first and second external electrodes respectively disposed on the third and fourth surfaces of the body and respectively connected to the first and second internal electrodes, each of the first and second external electrodes having a band portion extending at least to a first surface connecting the third and fourth surfaces, portions of the first and second external electrodes extending to the first surface being spaced apart from each other;
    first and second land portions disposed respectively on the band portions of the first and second external electrodes extending to the first surface, the first land portion having a first-cut-out portion and the second land portion having a second cut-out portion, each of the first and second cut-out portions having an area in a range from 0.2 to 0.5 times an area of corresponding band portions so as to secure adhesion/bonding strength at a certain level or more and acoustic noise at a certain level or less.

14. The multilayer electronic component of claim 13, wherein the first and second internal electrodes are disposed in parallel to the first surface.

15. The multilayer electronic component of claim 13, wherein the first and second internal electrodes are disposed perpendicular to the first surface.

16. The multilayer electronic component of claim 13, wherein the first and second land portions comprise an insulator.

\* \* \* \* \*